United States Patent [19]

Pickett et al.

[11] Patent Number: 4,866,001

[45] Date of Patent: Sep. 12, 1989

[54] VERY LARGE SCALE BIPOLAR INTEGRATED CIRCUIT PROCESS

[75] Inventors: James M. Pickett; Stanley C. Perino; Ralph E. Rose, all of Portland, Oreg.

[73] Assignee: Bipolar Integrated Technology, Inc., Beaverton, Oreg.

[21] Appl. No.: 296,899

[22] Filed: Jan. 11, 1988

Related U.S. Application Data

[63] Continuation of Ser. No. 214,856, Jul. 1, 1988, abandoned, which is a continuation of Ser. No. 19,359, Feb. 25, 1987, abandoned.

[51] Int. Cl.$^4$ .......................................... H01L 21/265
[52] U.S. Cl. ......................................... 437/32; 437/33; 437/241; 437/228; 148/DIG. 10; 148/DIG. 11; 357/35; 357/59
[58] Field of Search ...................... 437/31, 32, 33, 225, 437/233, 241, 238; 156/653, 643, 657; 148/DIG. 10, DIG. 11; 357/34, 35, 59 H

[56] References Cited

U.S. PATENT DOCUMENTS

| | | | |
|---|---|---|---|
| 4,276,543 | 6/1981 | Miller et al. | 340/347 AD |
| 4,433,471 | 2/1984 | Ko et al. | 357/35 |
| 4,495,010 | 1/1985 | Kranzer | 437/31 |

OTHER PUBLICATIONS

Pickett, J. M., "A Fully Self-Aligned Silicon MESFET Process," IEEE, 1981, pp. 123–126.
Buie, J., "Improved Triple Diffusion Means Densest ICs Yet," Electronics, Aug. 7, 1975, pp. 101–106.

Primary Examiner—Brian E. Hearn
Assistant Examiner—Kevin McAndrews
Attorney, Agent, or Firm—Marger & Johnson

[57] ABSTRACT

A bipolar VLSI process includes masking and patterning, implanting a P+ channel stop and locally oxidizing a lightly P-doped, monolithic silicon substrate to define a long, narrow collector region. An N-type collector is implanted in the collector region. The implants are diffused to form a shallow gradient P-N junction. Then, device features requiring a predetermined spacing and size are photolithographically defined along the length of the collector region. The device features and the collector region are made long enough for the features to readily transect the collector region even if the mask is misaligned. The active transistor and the collector, base and emitter contacts are self-aligned with the collector region so as to take advantage of the noncritical spacing of the preceding steps. A single polysilicon layer used to form base, collector and emitter contacts and a triple diffusion transistor. Portions of the substrate silicon and polysilicon are locally oxidized to isolate the contacts and to define emitter width. The width of the collector region defines emitter length.

35 Claims, 3 Drawing Sheets

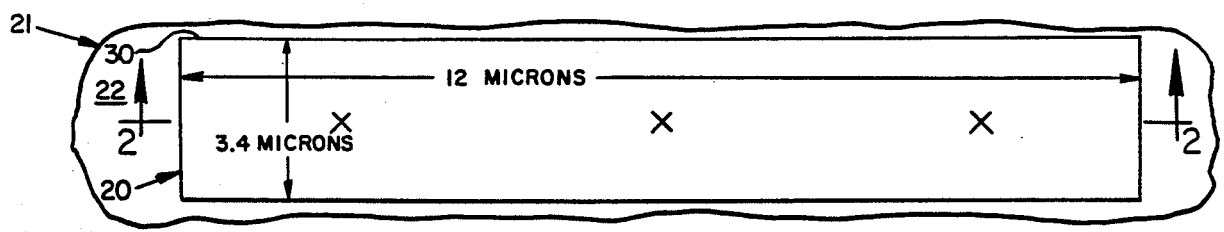
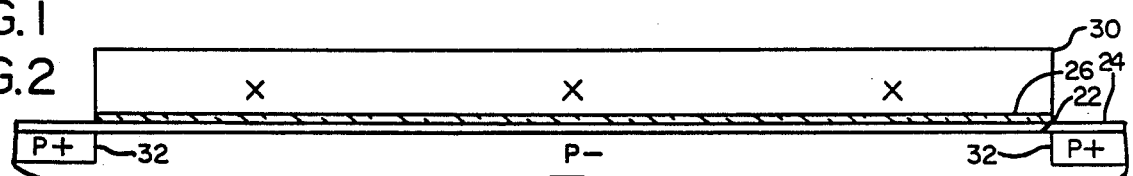
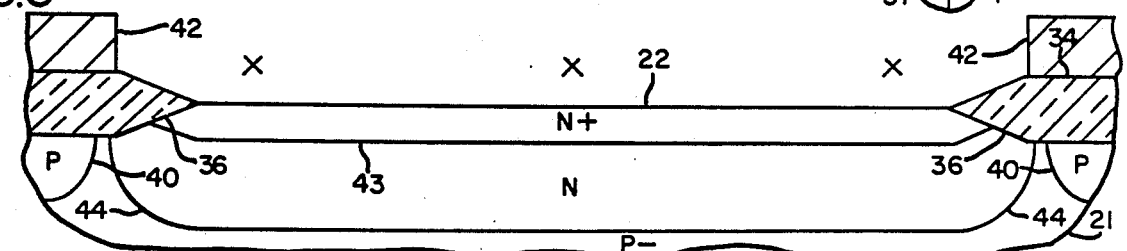
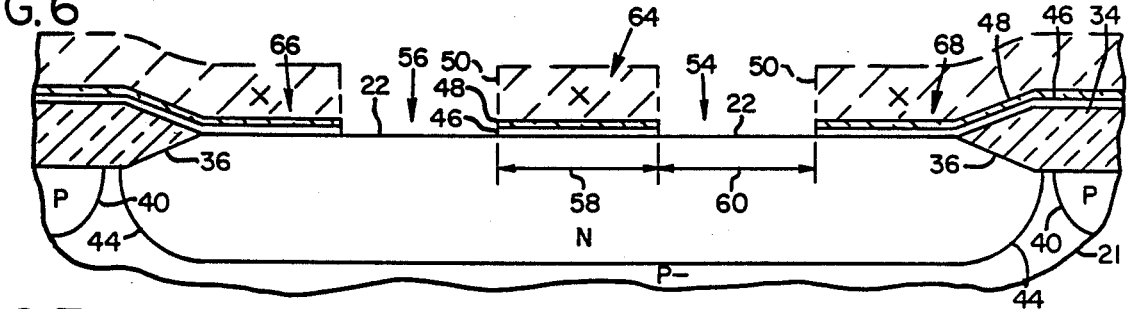
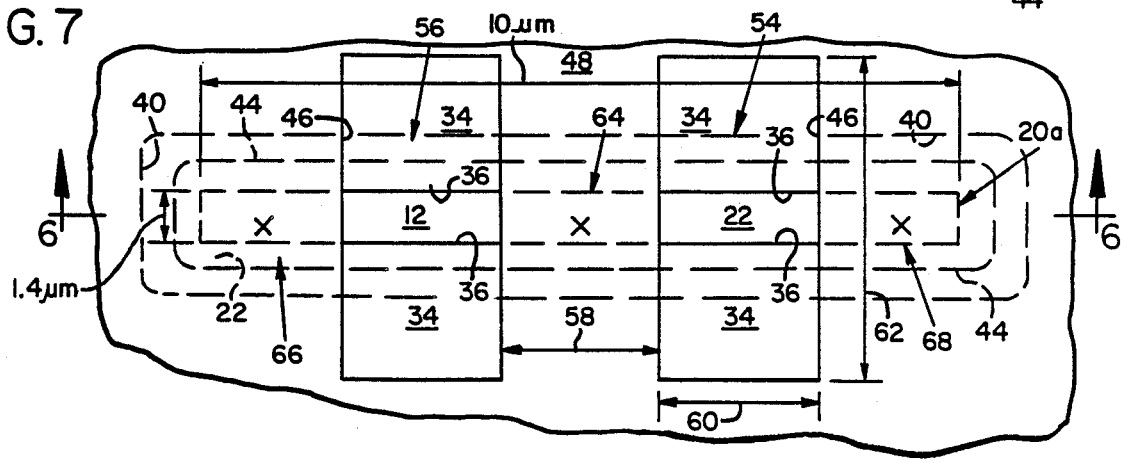

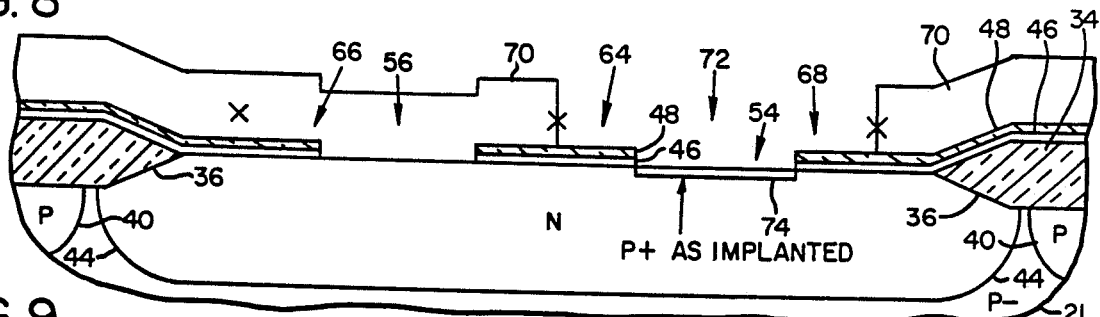
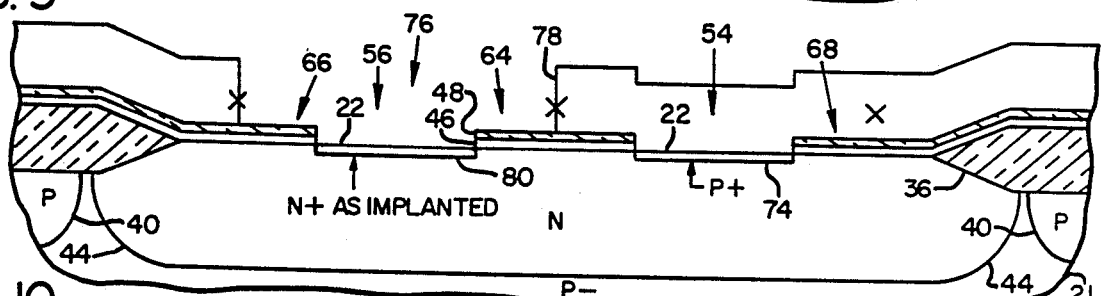
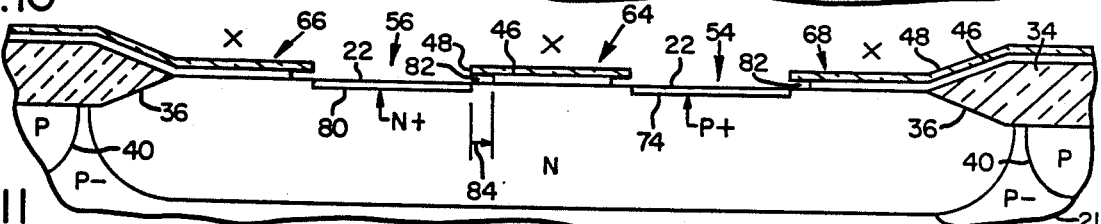
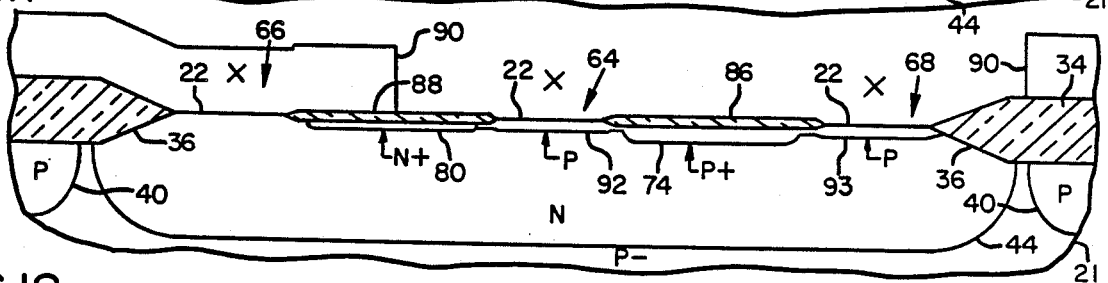
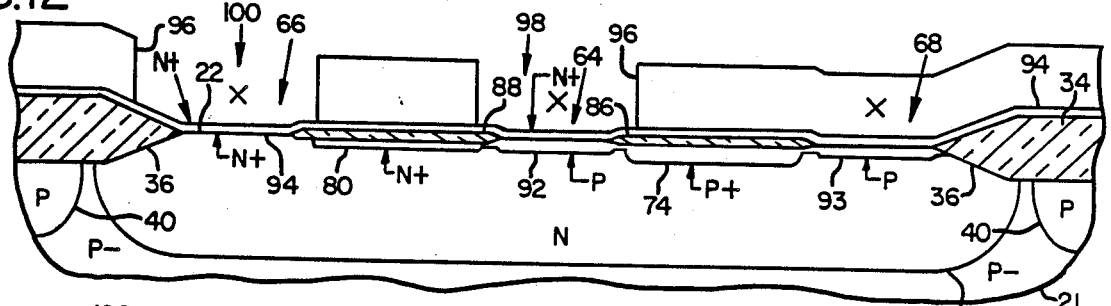
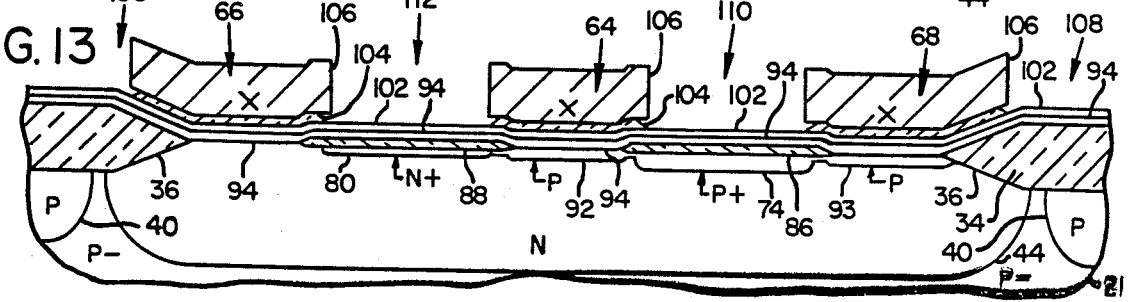

VERY LARGE SCALE BIPOLAR INTEGRATED CIRCUIT PROCESS

This is a continuation of co-pending application Serial No. 07/214,856, filed on July 1, 1988 now abandoned, which is a continuation of Ser. No. 07/019,359, filed Feb. 25, 1987, now abandoned.

BACKGROUND OF THE INVENTION

The present invention relates to processes for the fabrication of very small integrated bipolar transistors, and more particularly to a self-aligned process for fabricating a bipolar transistor with polysilicon contacts.

The trend in semiconductor technologies is toward large scale integration of devices with very high speed, high packing density and low power dissipation. Jointly achieving these characteristics always involves trade-offs, particularly between speed and power dissipation and between power dissipation and packing density.

In general, to achieve the objectives of high packing density, high speed and low power, it is essential that these devices be made as small as possible. In both bipolar and field-effect transistor technologies, it is desirable to reduce the horizontal geometry of the devices. In FET technologies, design objectives focus primarily on reducing gate length, which serves both to reduce the horizontal geometry of the device and to increase its speed of operation. In bipolar technologies, it is desirable to reduce both emitter area and the depth of the vertical junction structure.

Device horizontal geometry depends largely on the photolithographic techniques and tools available. The resolution provided by a particular photolithographic process determines the minimum feature size that can ordinarily be made in each masking step. Additionally, at very small feature sizes, alignment between mask steps becomes very critical. Although improvements continue to be made, conventional photolithography provides reliable resolution down to just under 2 um. Similarly, obtaining alignment tolerances much below 0.5 um. is very difficult with conventional equipment. As a result, obtaining an economic yield of operative devices becomes very difficult both as device size is reduced and as number of devices per chip is increased.

One of the early attractions of metal-oxide-semiconductor (MOSFET) technology stems from its simplicity, both in number of masking process steps needed to fabricate a device and in the relative ease of obtaining self-alignment between the gate electrode and adjoining diffused regions in the substrate. An example of such technology is shown in L. L. Vadasz et al., "Silicon-gate technology," IEEE Spectrum, October 1969, pages 28–35. More recent MOSFET technology additionally provides self-aligned source and drain electrodes, as shown for example in C. S. Oh et al., "A New MOSFET Structure with Self-Aligned Polysilicon Source and Drain Electrodes," IEEE Electron Device Letters, Vol. EDL-5, No. 10, October 1984, pages 400–402.

Notwithstanding the improvements shown by comparison of the above-cited references, size and alignment concerns are essentially one dimensional in MOSFET technologies. The width of the gate of FET devices is essentially a matter of design choice. Current MOS technology enable very large scale integrated (VLSI-over 10,000 gates per chip) circuits to be built with a high packing density and with low power requirements. Moreover, VLSI MOS circuits can be produced with a very high yield, commonly around 30%.

The primary disadvantage of MOS technologies, when compared to bipolar technologies, is speed. In MOS devices, gate delays commonly exceed one nanosecond when loaded, especially with a capacitive load. In contrast, bipolar devices can maintain gate delays of about one half nanosecond or better when capacitively loaded.

Bipolar technologies have generally lacked the advantages of MOS technologies. Bipolar devices generally require substantially more power than MOS devices. They also typically require substantially more substrate area per device. Conventional bipolar technologies using emitter-coupled logic (ECL) typically produce transistor areas of over 250 um.$^2$ and dissipate over 10 mW per gate (5 mW per equivalent gate) when operated at speeds providing system propagation delays of 300–500 ps. Common packaging technologies limit total chip power dissipation to around 10W. These factors result in a substantially lower packing density than MOS devices, limiting bipolar densities to less than 10,000 transistors per chip or about 3000 gates (compared to 10–20,000+ for CMOS), or a substantial tradeoff in speed. Also, because of their complexity, prior bipolar technology yields are low compared to MOS technologies by a factor of two or more (10–15%).

Consequently, commercial scale bipolar technologies have been largely limited to large scale integrated (LSI) circuit packing densities. Bipolar transistors produced by conventional LSI technologies typically have a cutoff frequency $f_t$ of around 3 GHz at 2 mA and exhibit 50 fF of junction capacitance.

In processing a substrate to fabricate a bipolar device, the designer may choose between an epitaxial or a triple diffusion technology. The epitaxial process predominates in commercial use. Examples of epitaxial processes are shown in U.S. Pat. No. 4,381,953 to Ho et al., U.S. Pat. No. 4,483,726 to Isaac et al. and in "A Bipolar Process That's Repelling CMOS," Electronics, Dec. 23, 1985, pages 45–47. Examples of triple diffusion technology are described in R. Wolfle, "Fast High-Voltage Silicon Triple-Diffused Power Transistors," Siemens Review XXXIX (1972) No. 8, pages 370–373, and in S. Konaka et al., "A 30 ps Si Bipolar IC Using Super Self-Aligned Process Technology," Extended Abstracts of the 16th (1984 International) Conference on Solid State Devices and Materials, Kobe, 1984, pages 209–212. An analysis of characteristics of epitaxial and triple-diffused transistors appears in W. J. Chudobiak, "On the Static Collector-Emitter Saturation Voltage of a Transistor with a Lightly Doped Collector," Proceedings of the IEEE, April 1969, pages 718–720.

The designer also has a number of choices of how to define various device features, such as active transistor area. Photolithographic techniques are widely used but, as mentioned above, are limited to the resolution of photolithography. In the fabrication of discrete bipolar devices, it is also known to employ controlled undercut techniques to form device features smaller than those provided by photolithography. This technique is described by F. Morandi et al., in "Controlled Undercut Microwave Devices," SGS-Fairchild, S.p.A., Milan, Italy, International Electron Devices Meeting, 23-2-5October 1968, Washington, D.C. (abstract published by IEEE 1968), page 108.

Various techniques are conventionally used in MOS technologies to define the device regions as well as to provide insulative field oxide layers over regions between devices. One is the LOCOS technique, described by J. A. Appels et al., "Local Oxidation of Silicon; New Technological Aspects," Philips Research Reports, Vol. 26, No. 3 (June 1971), pages 157–165, and by J.S. Makris et al., "Forming Fine-Line Geometries in Integrated Circuits," IBM Technical Disclosure Bulletin, Vol. 16, No. 10 (March 1974), pages 3240–3241. J.A. Appels et al. also disclose the use of controlled underetching of nitride-oxide sandwich structures (LOCOS-II method) in the preparation of MOS transistors. The LOCOS method, however, requires an extended heat cycle to grow the thick layer of thermal oxide. This is explicitly avoided in fabricating bipolar transistors in U.S. Pat. No. 4,381,953 (column 3, lines 5–6). Current bipolar technologies—exemplified by the Ho et al. and Isaac et al. patents and the Konaka et al. article—instead use various, planar etch-and-refill isolation techniques. A variation of such techniques that has been tried by Texas Instruments as a way to increase bipolar packing densities is trench isolation, reported in the "Electronics" article cited above.

Most of the efforts to solve alignment problems in both MOS and bipolar technologies have been directed to self-aligned processes. Various self-aligned processes are described in the patents cited above. State of the art in both MOS (see Ho et al.) and bipolar (see Oh et al.) technologies use a polysilicon layer patterned to form a gate or contact. This layer is covered by an insulative oxide box structure formed by silicon dioxide deposition or thermal growth followed by reactive ion etching. The box structure serves as a self-aligned mask in later ion-implantation steps.

In conventional bipolar processes, the active device features are generally formed as a square or nearly square emitter region concentrically positioned within a collector region of similar geometry. The self-alignment techniques strive to form the horizontal features in both dimensions and for several process steps using a single photolithographic mask. Deposition of polysilicon on the substrate surface followed by out-diffusion of the dopant impurities into the substrate or epitaxial layer has also been used in these self-aligned techniques. The above-cited patent to Oh et al. uses this technique to form base regions self-aligned with base contacts provided by the polysilicon. Konaka et al., cited above, discloses use of a highly-doped polysilicon emitter contact to form a diffused emitter.

So far as known, no prior integrated circuit fabrication process has been devised that will enable operative very large scale integrated (VLSI) bipolar circuits to be made. Accordingly, a need remains for a bipolar integrated circuit technology that will enable commercially-feasible, very large scale integration of bipolar circuitry.

SUMMARY OF THE INVENTION

One object of the invention is to build an integrated circuit fabrication process which produces high density fast, low power, bipolar integrated circuits.

A second object of the invention is to bring to bipolar technology the MOS technology advantages of high yield, high density and low power while obtaining the speed advantages of bipolar devices.

A third object of the invention is to enable fabrication of bipolar VLSI circuits.

Another object is to increase the speed of VLSI circuits.

A further object of the invention is to reduce the power requirements of high-speed bipolar transistors.

Yet another object of the invention is to improve yield in the production of bipolar integrated circuits, particularly in LSI and VLSI levels of complexity.

The invention attains the foregoing objects, and overcomes the difficulties and drawbacks of the prior art in a number of ways. Photolithographic resolution problems are solved by limiting the use of photolithography to the definition of features and feature sizes that are readily within the resolution capabilities of generally available photolithographic techniques. These techniques are supplemented, where necessary to define smaller horizontal feature sizes, by a combination of horizontally additive and subtractive masking techniques. These techniques are selected and controlled so as to define, with greater accuracy, feature sizes smaller than photolithographic techniques alone can readily produce. Alignment concerns are alleviated, with increased packing density, by adopting a masking strategy which renders most alignment steps noncritical within the tolerances that are readily provided by conventional alignment equipment. In general, this is done by separating the steps which define device features in each horizontal dimension.

Thus, in a preferred embodiment, a long, narrow collector region is formed in one step, the width of the collector region ultimately defining emitter length. Then, in a subsequent masking step, device features requiring a predetermined spacing and size are defined along the length of the collector region. The device features in this masking step are made long enough that they can readily transect the collector region even if the mask is misaligned at the tolerance limits of the alignment equipment. The collector region itself is made long enough to permit a similar degree of misalignment of the mask along its length.

Self alignment of the collector region, the active transistor, and the collector, base and emitter contacts, is preferably used. The self-alignment scheme is designed to take advantage of the noncritical spacing of the preceding steps and uses steps which, themselves, are relatively simple and virtually foolproof. A single polysilicon layer can be used to form base, collector and emitter contacts, without building oxide box structures or using reactive ion etching. Preferably, the process is carried out using a triple diffusion, rather than epitaxial, technique.

These measures simplify the fabrication process, improve yield and packing density, and provide advantageous device characteristics. Despite a very high packing density, difficult isolation techniques such as trench isolation, as shown in various above-cited references, are not required. The problems of aligning a buried layer surrounding isolation, and active device features in an epitaxial process are all avoided. Nor is intimate alignment of collector and base contacts with the emitter contact required.

VLSI bipolar integrated circuits having over 10,000 gates (25–50,000 transistors) per chip have been successfully fabricated in accordance with the preferred embodiment of the invention as described hereinafter. These circuits exhibit performance comparable to conventional ECL devices but with a transistor area 1/20 as large and per gate power dissipation 1/10 as large as in conventional ECL bipolar devices. Moreover, these density and performance advantages have been obtained at production yields comparable to established MOS processes, two times conventional bipolar processes.

The foregoing and other objects, features and advantages of the invention will become more readily apparent from the following detailed description which proceeds with reference to the drawings.

BRIEF DESCRIPTION OF THE DRAWINGS

FIG. 1 is a top plan view of a silicon substrate showing a collector region in which an NPN bipolar transistor is to be formed in accordance with the invention.

FIG. 2 is a cross-sectional view taken along lines 2—2 in FIG. 1 showing initial deposition, collector photolithography, etching and field implantation steps.

FIG. 3 is a view similar to FIG. 2, showing a nitride etch and undercut step.

FIG. 4 is a view similar to FIG. 3, showing the steps of stripping the low temperature oxide from the nitride layer and local oxidation of the field regions.

FIG. 5 is a view similar to FIG. 4, showing the steps of stripping the nitride layer and collector photolithography, ion implantation and drive-in.

FIG. 6 is a view similar to FIG. 5, showing the steps of low pressure vapor depositing successive layers of nitride and low temperature oxide, contact photolithography, and successive etching of the oxide and nitride layers.

FIG. 7 is a top plan view of the collector region as shown in FIG. 6.

FIG. 8 is a view similar to FIG. 6, showing P+ photolithography and ion implantation steps to form a conductor in the substrate between the base contact and emitter regions.

FIG. 9 is a view similar to FIG. 8, showing N+ photolithography and ion implantation steps to form a conductor in the substrate between the emitter and collector contact regions.

FIG. 10 is a view similar to FIG. 9, showing the step of undercutting the nitride layer.

FIG. 11 is a view similar to FIG. 10, showing the steps of stripping the low temperature oxide layer, base oxidation of the exposed silicon substrate, stripping of the nitride layer, and base photolithography and P implantation of the emitter and base contact regions of the substrate.

FIG. 12 is a view similar to FIG. 11, showing the steps of deposition of a polysilicon layer, photolithography and N+ implantation of the polysilicon in the collector contact and emitter regions.

FIG. 13 is a view similar to FIG. 12, showing the steps of depositing of a third pair of successive layers of nitride and oxide, photolithography and etching of the oxide layer to selectively expose the nitride layer over the base oxide and field oxide regions.

DETAILED DESCRIPTION OF PREFERRED EMBODIMENT

Figure 14:
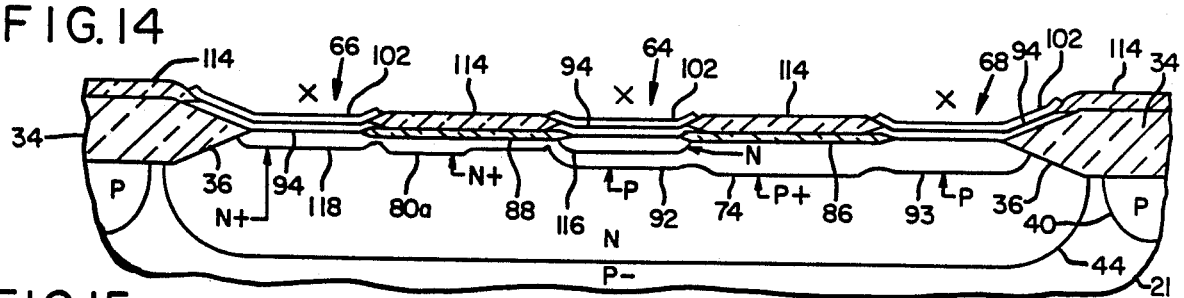
FIG. 14 is a view similar to FIG. 13, showing the steps of etching the nitride layer, stripping the oxide layer and local oxidation of the exposed polysilicon.

The below-described process is carried out on a substrate in the form of a <111> silicon wafer that has been lightly (P−) boron doped to provide a resistivity of greater than 30 ohm-cm. FIGS. 1–17 relate to the fabrication of a bipolar transistor, in accordance with the method of the present invention, on the silicon substrate in a predetermined, rectangular collector region 20. In laying out a VLSI-density circuit, a plurality of rectangular regions 20 of uniform length and width are positioned at a uniform spacing. In FIG. 1, for example, region 20 is shown as 3.4 um. wide and 12 um. long. A suitable spacing is provided by an 8 um. pitch in the widthwise direction and 16 um. in the lengthwise direction. These dimensions can be further reduced, e.g., by reducing pitch to a 1.2 um. spacing, or by scaling down device features within region 20, or both.

Prior to the steps shown in the figures, a thin (75 angstrom) pad oxide ($SiO_2$) layer is thermally grown on the surface of the substrate by dry oxidation, as known in the art. For purposes of the remaining description, the bulk of the substrate is identified by reference numeral 21, with a reference surface 22, upon which the process steps are carried out. The pad oxide layer is not shown, but is understood to form surface 22 of the substrate.

Referring to FIGS. 1 and 2, the process commences with low pressure chemical vapor deposition (LPCVD) of a layer 24 of nitride, followed by a layer 26 of low temperature oxide ($SiO_2$). Each of these layers is deposited to a thickness of approximately 1,000 angstroms. Next is a collector photolithography etching step. In this step, the region in which the bipolar transistor device is to be formed is covered with a layer of photoresist 30 which is rectangular in shape and has long, narrow dimensions, e.g., 12 um.×3.4 um. The oxide layer 26 is etched away around the photoresist to expose the surface of nitride layer 24. (HF-etch is used in all oxide etching steps.) This is followed by a field implantation step, in which the field regions surrounding the regions covered by photoresist layer 30 are ion implanted with boron to a depth of about 4,000 angstroms and a P+ concentration to form implanted channel stops 32.

Referring to FIG. 3, the next step is a first nitride etching step, to remove the nitride layer from the exposed field regions of the substrate. This etching step is carefully controlled to provide an undercut or recess 33, beneath the margins of oxide layer 26, for a distance 35 of about 5,000 angstroms. Then, the photoresist layer 30 is removed. This and subsequent nitride etching and stripping steps are carried out in a refluxer with a boiling (158° C.), concentrated phosphoric acid bath. The etch rate is about 40 angstroms per minute. The etch duration is controlled to determine the amount of undercut. The amount of undercut is preferably controlled to within plus or minus 20%. This undercutting spaces or insets the edge of the nitride layer relative to the inner boundary of implanted channel stops 32.

Referring to FIG. 4, the wafer is next subjected to an etching step to strip off the remainder of oxide layer 26, leaving the upper surface of nitride layer 24 exposed. Then, the wafer is subjected to an oxidation step at 950° C. for five hours locally to oxidize the exposed field regions, and thereby form field oxide layer 34. This step pushes a "bird's beak" oxide formation 36 beneath the margins of the nitride layer. The distance 37 of the protrusion of the bird's beak formation beneath the nitride is controlled, by controlling the thickness 38 to which the field oxide is grown, to precisely define the final dimensions of a narrow, reduced collector region. The oxide layer is preferably grown to a thickness 38 of about 8,000 angstroms, and the bird's beak correspondingly intrudes a distance of about 5,000 angstroms beneath nitride layer 24. The initial collector region width of 3.4 um. is reduced by an average of 1.0 um. by the nitride undercutting and then by an average 1.0 um., providing an average final width of 1.4 um. At the same time, the length of the collector region is reduced to about 10 um. This produces a reduced collector region 20a, as shown in FIG. 7.

Also, during the local oxidation step, the channel stop ions diffuse to form a broadened channel stop 40 of a P doping concentration. In a later step, shown in FIG. 5, a collector region implant 43 is diffused downward and laterally toward the channel stop. With the foregoing initial spacing, the resulting diffusion 44 forms a wide, shallow-gradient P-N junction with channel stop 40. This wide junction exhibits less capacitance than appears in epitaxial processes.

The foregoing steps employ a variation of the known LOCOS methods (see Philips Research Report 26, pages 162-63). The prior LOCOS methods were developed in MOS technologies to define the dimensions of MOS source and drain regions. They are not believed to have been used before in fabricating bipolar devices, particularly to critically define a small, nominally 1.4 um. emitter length and a spacing of the edges of the active device region from the junction between the diffused field channel stop 40 and collector region 44. The undercutting and local oxidation steps are statistically independent and variations are characterized by a Gaussian distribution. Controlling each to within, e.g., 20% tolerances (3 sigma), the combined precision of definition of the emitter length will be satisfactorily maintained at 1.4 um. +/−.28 um., i.e., between about 1.1 um. and 1.7 um. Likewise, channel stop 40 remains spaced sufficiently from reduced collector region 20a over the foregoing range of variation.

Referring next to FIG. 5, a second nitride etch step is used to strip nitride layer 24, exposing substrate surface 22. This is followed by a second photolithography step, in which the field oxide layers are covered with a layer 42 of photoresist while leaving the silicon surface exposed in the reduced collector region. This step is followed by a collector region implant step, in which phosphorus ions are implanted to a depth of about 4,000 angstroms and an N+ concentration to form implanted collector region 43. Photoresist layer 42 is then stripped and the wafer is annealed at a temperature of 1100° C. for two hours, to diffuse or drive in the collector implant ions to a depth of about 1.4 um. This forms a much broader and deeper diffused collector region 44 with an N doping concentration.

Referring to FIG. 6, next a 1,500 angstrom layer 46 of nitride ($Si_3N_4$) followed by a 1,000 angstrom layer 48 of oxide ($SiO_2$) are low pressure chemical vapor deposited on the entire surface of the wafer, including over the field oxide and exposed substrate surfaces 22. This is followed by a third photolithography step which provides a layer of photoresist 50 having openings 54, 56 spaced apart a distance 58. The oxide layer 48 is etched within openings 54, 56, the resist is stripped, and nitride layer 46 is etched through these openings to selectively expose portions of substrate surface 22 within the openings.

Referring to FIG. 7, which shows the step of FIG. 6 in top plan view, openings 54, 56 are rectangular and parallel, with a spacing 58 and a width 60 of, e.g., 2 um. and a greater length 62, e.g., 4 um. The regions thus defined in this step are identified as the emitter region 64, the collector contact region 66, and the base contact region 68. Their longer dimension 62 is oriented approximately normal to the longer dimension of the collector region 20a. The spacing 58 between openings 54, 56 defines the emitter width which, for high density VLSI applications, is preferably 2 um. or less. The 2 um. width and spacing of the openings are selected to be easily within the resolution capabilities of conventional photolithographic techniques. As these techniques improve, these dimensions can be reduced to scale the present method to smaller device geometries.

The normal orientations of the long dimension of openings 54, 56 in relation to the length of collector region 20, and the fixed spacing 58 in a single mask of such openings makes alignment in this step substantially noncritical. Ideally, these openings are centered both widthwise and lengthwise on reduced collector region 20a, but need not be. The openings can be displaced from a centered position, either lengthwise along region 20a, or widthwise of the region. So long as openings 54, 56 transect region 20a with some minimal length, e.g., 1 um., of region 20a at each end to form collector and base contacts, an operative device can be fabricated. Thus, widthwise and lengthwise alignment tolerances of +/−1um. are permitted while conventional alignment equipment can readily meet +/−0.5 um. tolerances. Also, angular alignment tolerances can be much looser than conventional techniques (e.g., 10:1 projection alignment and E-beam masking) are able to provide.

Referring to FIG. 8, a fourth photolithography step is performed to provide an implant mask, photoresist layer 70 defining an opening 72 which encompasses opening 54. Boron ions are implanted through opening 54 to form a P+ low resistivity region or conductor 74 from an active transistor, to be formed in emitter region 64, to the base contact region 68. Implantation is conducted at relatively low energies so that conductor 74 is relatively shallow, e.g., 1,000 angstroms as implanted. At that energy level, the ions do not penetrate the nitride and oxide layers 46, 48. Consequently, the alignment of implant mask for this step is also substantially noncritical.

Referring to FIG. 9, photoresist layer 70 is removed. The mask and ion implant procedure illustrated and described in FIG. 8 is repeated to implant phosphorus ions through opening 56 to selectively implant within a larger opening 76 in photoresist 78 a shallow, e.g., 1,000 angstroms as implanted, N+ low resistivity region or conductor 80 between the emitter region 64 and collector contact region 66.

Referring to FIG. 10, photoresist layer 78 is removed. The wafer is subjected to an etching step, like that described in connection with FIG. 3, to undercut nitride layer 46 to form recesses 82 under oxide layer 48. This step is controlled to space the edge of nitride layer 46 a predetermined distance 84 (e.g., 2,500 angstroms) from the implant boundaries of conductors 74, 80. This step reduces the as-masked dimension of emitter region 64 from 2 um. to about 1.5 um.

Referring next to FIG. 11, oxide layer 48 is stripped. The wafer is subjected to a thermal oxidation step (900° C., 1 hour) to form thin (e.g., 1,000 angstrom) base oxide films 86, 88 on the exposed substrate surface in openings 54, 56, respectively. These films overlap implanted conductors 74, 80, respectively, by an amount determined by the distance 84 of undercut 82. This step produces some additional reduction in width of the emitter region, e.g., to about 1.0 um. The implants forming conductors 74, 80 also slightly diffuse downward and laterally.

After the base oxide films are formed, the remainder of nitride layer 46 is stripped. Then, a fifth photolithography step is performed to provide a layer 90 of photoresist covering collector contact region 66 and extending over a portion of base oxide film 88, while leaving the emitter region 64 and base contact region 68 exposed. This is followed by a base implant step in which regions 64, 68 are implanted with boron ions to form a base implant 92 in emitter region 64 and a base conductor 93 in the base contact region 68. Implantation is conducted at energy levels comparable to those used in performing the P+ implant in FIG. 8. The doping concentrations, however, are somewhat lower, producing a P concentration. Some of the implanted ions penetrate the base oxide layers 86, 88. This somewhat increases the doping concentration in P+ region 74. It somewhat reduces the N-type doping concentration of region 80, although such region nevertheless remains N+ in net doping concentration. Also, as a result of ion penetration of the base oxide, implants 92 and 93 are connected beneath the margins of base oxide layers 86 to P+ region 74. The doping profile is further illustrated and discussed in connection with FIG. 16b.

Referring to FIG. 12, photoresist 90 is removed and the pad oxide (not shown) is stripped. A thin (e.g., 1,000 angstrom) layer 94 of LPCVD, undoped polysilicon is applied to the entire surface of the substrate, including over substrate surface 22 in regions 64, 66, 68. This layer also extends over the top surface of the field oxide 34 and base oxide layers 86, 88. After deposition of the polysilicon layer, a sixth photolithography step is performed to provide a photoresist layer 96 having an opening 98 over emitter region 64 and an opening 100 over collector contact region 66. These openings are sized, spaced, oriented and aligned in the same way as openings 54, 56 (FIGS. 6 and 7). Arsenic ions are implanted through these openings to implant the exposed portions of the polysilicon layer in the collector contact region 66 and in the emitter region 64. Subsequent diffusion of arsenic ions into the substrate silicon forms the emitter of an NPN transistor. This implantation step is performed by low-energy implantation to produce a shallow, although heavy (N+), doping concentration.

Referring to FIG. 13, resist layer 96 is stripped. A nitride layer 102 and an oxide layer 104 are deposited, by low pressure chemical vapor deposition, over the entire substrate. This is followed by a seventh photolithography step, to define a photoresist layer 106 selectively covering the emitter region 64 and the collector and base contact regions 66, 68, while leaving openings 108 over the field oxide and openings 110, 112. Like openings 54, 56 in FIG. 7, openings 110, 112 are non-critically aligned over the base oxide regions 86, 88, respectively. Oxide layer 104 is etched through these openings.

Next, referring to FIG. 14, resist layer 106 is stripped and nitride layer 102 is etched. Then, oxide layer 104 is stripped. This procedure leaves the upper surface of polysilicon layer 94 exposed atop the field oxide 34 and over base oxide regions 86, 88. The polysilicon layer 94 over the emitter region 64 and collector and base contact regions 66, 68 is shielded by the remaining portions of nitride layer 102. Finally, the wafer is subjected to an oxidation step at 950° C. for one hour to locally oxidize the exposed portions of polysilicon layer 94. In these areas, the polysilicon is converted to polyoxide 114, which insulates the remaining regions of polysilicon 94 over the emitter region 64 and collector and base contact regions 66, 68 from one another. The oxidation step also drives ions into the substrate from the doped regions of the polysilicon in collector contact regions 66 and emitter region 64. The out-diffusion of arsenic ions from the polysilicon in the emitter region forms the emitter 116 of the transistor. It also forms the collector contact conductor 118. This diffusion is launched only from the interface of the polysilicon layer with the reference surface. (This is so because diffusion proceeds very slowly through silicon dioxide.) Diffusion provides a concentration gradient that is greatest at the reference surface. Consequently, formation of a parasitic, off-vertical, edge transistor surrounding the vertical transistor is minimized. Therefore, the performance characteristics (i.e., breakdown voltage, speed) of the vertical transistor are not degraded by presence of a parasitic transistor.

Figure 15:
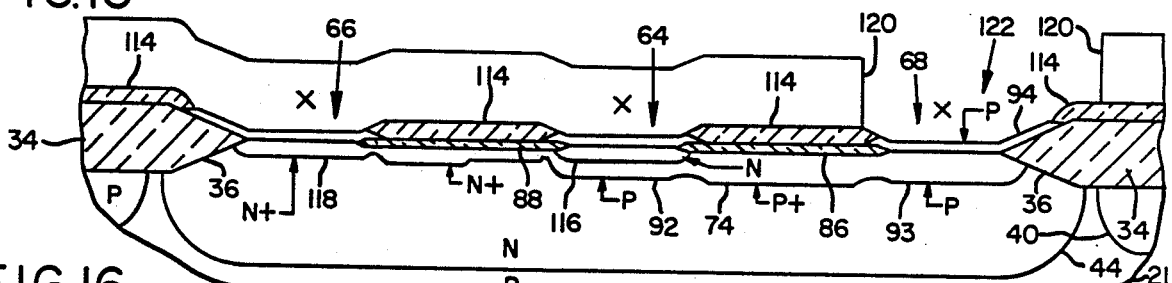
FIG. 15 is a view similar to FIG. 14, showing the steps of stripping the nitride layer, photolithography and P implantation of the polysilicon in the base contact region.

Referring to FIG. 15, nitride layer 102 is stripped. This is followed by an eighth photolithography step to provide a layer of photoresist 120 having an opening 122 noncritically aligned over base contact region 68. The polysilicon layer 94, exposed in this opening is then shallowly implanted with boron ions to render the base contact conductive.

Figure 16:
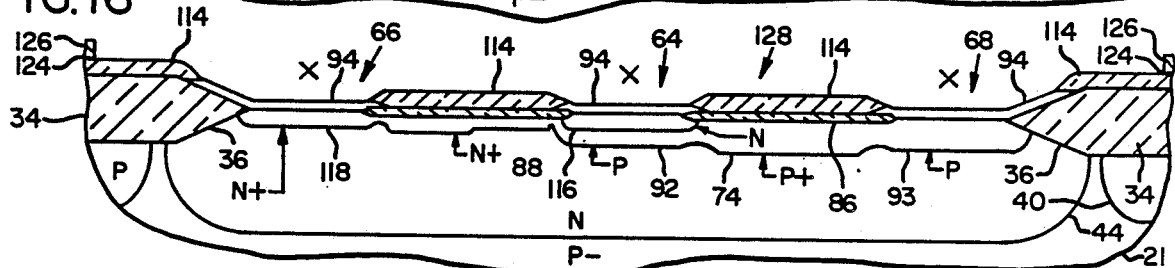
FIG. 16 is a view similar to FIG. 15, showing the further steps of low pressure chemical vapor deposition of a fourth pair of layers of nitride and oxide and photolithography and etching to selectively expose the polysilicon contact layers in the collector and base contact regions and the emitter region.

Referring to FIG. 16, photoresist layer 120 is stripped. A thin (250 angstrom) and nitride layer 124 and a 2,000 angstrom oxide layer 126 are deposited by low pressure chemical vapor deposition. This deposition step is followed by a ninth photolithography step, in which a layer of photoresist (not shown) is applied and patterned to form an opening 128 over the entire collector region. As further described below, this step serves to define other devices (see FIGS. 16a and 16b) formed on the substrate in preparation for metallization. The oxide layer 126 is etched through opening 128, the photoresist is removed, and the nitride layer 124 is etched to expose the upper surfaces of the polyoxide layer 114 and polysilicon layer 94 in the emitter region 64 and collector and base contact regions 66, 68.

Figure 17:
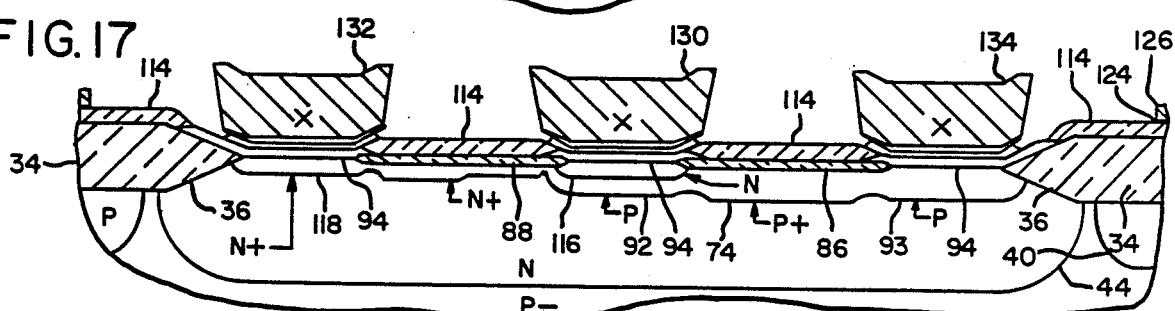
FIG. 17 is a view similar to FIG. 16, showing metallization of the contacts.

Referring to FIG. 17, metallization is preferably accomplished by an additive process such as ion plating.

As shown, the metallization lines are sized and spaced at a 4 um. pitch, but can be scaled along with preceding steps in the process as photolithographic techniques permit. The particular metallization process and structure form no part of the present invention and so are only briefly described. The preferred metallization method and structure is conventional (see, for example, Summers, D. "A Process for Two-Layer Gold IC Metallization," "Solid State Technology," December 1983, pages 137-141, and references cited therein). Briefly, this metallization process calls for depositing a thin film of palladium, reacting the palladium with the exposed surface of the polysilicon to form a silicide, and stripping the unreacted palladium. Next, a thin layer of a barrier metal such as titanium tungsten (TiW) is deposited, followed by deposition of a plating layer of palladium. This is followed by a metal photolithography step and ion plating a thick layer of gold onto the palladium to form emitter contact 130, collector contact 132 and the base contact 134. Additional insulative and conductive layers may be applied to form multilayer interconnects, as will be understood by those skilled in the art.

Figure 14A:
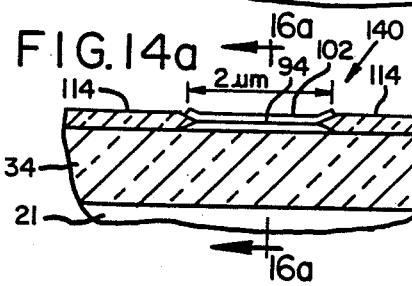
FIG. 14a is a cross-sectional view of a resistor fabricated in accordance with the process of the invention, at the stage of fabrication of the transistor shown in FIG. 14, showing the photolithography, etching and local oxidation steps as used to define the width of the resistor.
Figure 16A:
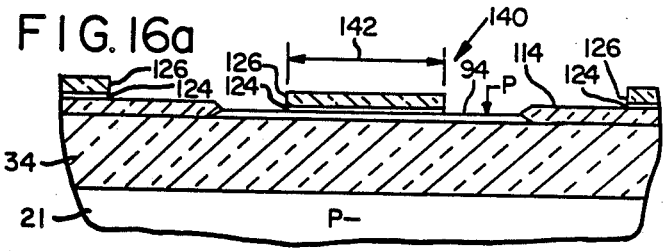
FIG. 16a is a cross-sectional view of the resistor taken along lines 16a—16a in FIG. 13a, showing the photolithography and etching steps at a stage of fabrication corresponding to FIG. 16 as used to define the length and contact regions of the resistor.

Referring next to FIGS. 14a and 16a, the foregoing method can be used easily to make resistors in a VLSI bipolar circuit. A resistor 140 is formed atop field oxide 34 at a location spaced conveniently (e.g., 4 um. pitch) from other structures. The polysilicon layer 94, deposited in the steps shown in FIG. 12, is patterned in the manner as shown in FIG. 13. Then, as shown in FIG. 14a, photoresist 106 and oxide layer 104 are removed, leaving an elongate strip of nitride layer 122 shielding a narrow portion of the polysilicon layer 94. The width of this strip is conveniently set at 2 um., and initially defines the width of resistor 140. Then, in the local oxidation step of FIG. 14, the exposed portions of the polysilicon are oxidized. This step isolates resistor 140 and defines a reduced, final width of the resistor, about 1.7 um.

Proceeding to the steps shown in FIG. 15, the nitride layer over the resistor is removed. The resistor polysilicon is then implanted with P-type boron ions simultaneously with implanting the base contact region 68.

Next, nitride and oxide layers 124, 126 are deposited and patterned as shown in FIG. 16a. This step defines the length 142 of the resistor, which can vary as required by the circuit design. A typical resistor length is 6.5 um. This step also provides contact openings at each end of resistor 140 for contact by metallization lines in the manner shown in FIG. 17. The contact openings are preferably sized and oriented in the manner shown in FIG. 7 so that alignment is noncritical.

Figure 16B:
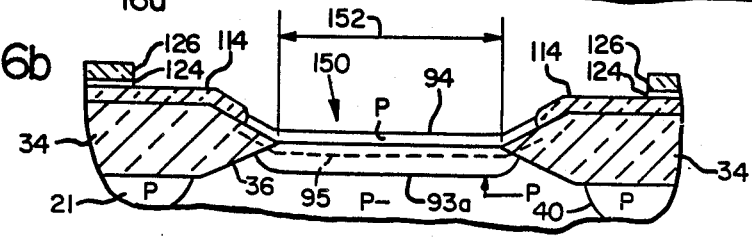
FIG. 16b is a cross-sectional view taken along the same plane as FIG. 16, showing fabrication of a substrate contact in accordance with the process of the invention.

FIG. 16b shows how a substrate contact 150 is formed in the disclosed method. In general, such a contact is formed in the same manner as a collector region, described above, with the differences next described. At the stage of fabrication shown in FIG. 5 the region where the substrate contact is to be formed is left covered by photoresist 40, so that it does not receive an N-type collector implant. It is covered by nitride and oxide layers 46, 48 and remains covered throughout the steps shown in FIGS. 6-10.

In the steps of FIG. 11, the region is opened for P-type implant 93a. The doping profile of implants 93, 92a has a peak, as-implanted concentration at a predetermined depth illustrated in FIG. 16b by dashed line 95. This depth is preferably about 1,000 angstroms and is determined by controlling implant energy. This depth is essentially constant in both silicon and silicon dioxide. Thus, the implant can extend beneath the bird's beak 36 but, because of the orientation of the surfaces of the bird's beak structure, the P-doped region terminates at the silicon-silicon dioxide interface as shown.

Then, in the steps shown in FIG. 12, it is covered by polysilicon layer 94 and by photoresist 96 to shield it from the N-type polysilicon implant. It is selectively covered during the steps of FIGS. 13 and 14, by nitride, oxide and photoresist layers 102, 104, 106 to pattern the polysilicon contact and to isolate it by local oxidation of the surrounding polysilicon. The substrate contact region is then opened in the steps of FIG. 15 for P-type implantation of the polysilicon layer. Referring to FIG. 16b, nitride and oxide layers 124, 126 are deposited, masked and patterned to selectively expose substrate contact 150. This step provides a contact opening for contact to the substrate by a metallization line in the manner shown in FIG. 17.

Several different types of LSI and VLSI bipolar circuits have been successfully manufactured in production quantities using the foregoing process. One such circuit is 16×16 bit fixed point multiplier, produced in both ECL and TTL versions. This circuit is fabricated on a 180 mil × 180 mil die with an adder array totalling 11.6K transistors in an area of 121 mils × 135 mils. Control circuitry, on-chip latches and ECL 10KH input/output buffers bring the total transistor count to 13.8K in a 166 mil × 178 mil area. Typical power dissipation is 1.8 W in the adder array alone; input/output buffers, latches and control circuitry raise the total typical power to 2.9 W (2.2 W in TTL). The typical multiply propagation time for the worst-case path from input latch to output latch is 12 ns. Within the circuit, two-level series gating is used with a single −5.2 V supply. One subcircuit used in the multiplier is a 44-transistor, carry-save adder. The total gate size including fifteen polysilicon resistors is 9,200 um.$^2$. In terms of equivalent gates, this real subcircuit packs one gate per mil$^2$ at a power of 0.3 mW per equivalent gate. These are circuit densities equivalent to those produced by 1.5 um. CMOS technologies and power levels less than 1/10 of conventional bipolar integrated circuitry. Propagation delays are typically 300-600 ps per gate, depending on gate complexity and loading. At the transistor level, transistor size is 14 um.$^2$, cutoff frequency $f_t$ is greater than 5 GHz at 50 uA, and junction capacitances are on the order of 5-10 fF. In production of the multiplier circuits, the foregoing process exhibited very high yields, about 50% averaged over 10 production runs of 10 wafers each. Higher yields on some runs indicate that yields could increase to over 60% with experience.

Larger circuits have also been fabricated with corresponding success. One is 64×18-bit five-port register file. This circuit is fabricated on a 290 mil ×290 mil die and includes 45K transistors. The ECL version of this circuit has a power dissipation of 3.9 W (3.0 W for TTL), a typical read-write cycle time of 6 ns, a worst-case read-cycle time of 10 ns (15 ns for TTL), and throughput rates as high as 100 MHz. Average yield on a limited number of production runs (two runs of 20 wafers each) was 19%, but yields on individual wafers indicate potential for yields approaching 50%.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A method of making a bipolar transistor in a very large scale integrated circuit, comprising:
   providing a lightly doped P-type silicon substrate having a reference surface for forming an integrated circuit;
   delineating a collector region having a length and a width bounded at the substrate surface by an insulative surface layer and within the substrate by means defining a P-type channel stop beneath the insulative layer;
   sizing the collector region so that the length is greater than the width by a multiple of said width;
   forming an N-doped collector, junction-isolated within the P-type substrate, that is dimensionally defined by said collector region;
   making and patterning an area encompassing the collector region so as to define a pair of openings wherein portions of the reference surface are exposed within the collector region;
   sizing each opening to a width no greater than a predetermined fraction of the length of the collector region and to a length greater than the width of the opening;
   mutually positioning the openings so that the openings are parallel in a lengthwise direction and spaced apart in a widthwise direction by a predetermined spacing approximately equal to the width of the openings;
   orienting the two openings so that both openings transsect the collector region and thereby divide the collector region lengthwise into three spaced-apart regions including a collector contact region at one end of the collector region, a base contact region at the opposite end, and an emitter region spaced between the collector contact and base contact regions;
   forming low resistivity regions in the collector region within said openings, including an N-type low resistivity region extending between the collector contact and emitter regions immediately subjacent the exposed portion of the reference surface and a P-type low resistivity region between the base contact and emitter regions;
   forming an NPN intrinsic bipolar transistor by successive diffusion of a P-type base and N-type emitter in the emitter region, the emitter having a length defined by the width of the collector region and a width defined by the spacing between said openings; and
   forming collector, base and emitter contacts respectively in the collector and base contact regions and emitter region;
   the N-type low resistivity region coupling the collector contact to a portion of the collector laterally adjoining the emitter region.

2. A method according to claim 1 in which the masking and patterning step includes:
   depositing a layer of a first insulative material and a layer of a second insulative material, in turn, onto the substrate surface and insulative surface layer, the first and second materials being selectively susceptible to first and second etchants, respectively; and
   selectively removing the layers of first and second materials from the openings in the masked area to expose portions of the reference surface therein while leaving the collector contact, base contact and emitter regions covered.

3. A method according to claim 2 in which the first material is nitride and the second material is silicon dioxide.

4. A method according to claim 2 including:
   undercutting the layer of first material a predetermined distance beneath the layer of second material around each of said exposed portions of substrate surface; and
   forming a silicon dioxide layer so as to cover the exposed portions of the substrate surface over said low resistivity regions, including a margin thereof defined by the distance of undercutting to produce a reduced emitter region having a width defined by the spacing between the two openings less two times the sum of the first and second distances.

5. A method according to claim 4 including ion-implanting dopant ions solely in the exposed portions of the substrate to form said low resistivity regions, spaced from the reduced emitter region by said margin.

6. A method according to claim 4 in which the silicon dioxide layer over the low resistivity regions is formed by local oxidation so that the layer intrudes a second distance beneath the layer of second material to define a further reduced emitter region.

7. A method according to claim 2 in which the steps of forming the contacts and intrinsic transistor include:
   forming an insulative layer on each of the exposed portions of the reference surface in said openings;
   removing the layers of said first and second materials to expose the reference surface in the collector contact, base contact and emitter regions; and
   forming silicon layers over each of said collector and base contact and emitter regions;
   selectively doping the silicon layer over the emitter and the collector contact regions with N-type ions; and
   selectively doping the silicon layer over the base contact region with P-type ions.

8. A method according to claim 1, in which forming the contacts and intrinsic transistor includes:
   forming an insulative layer selectively over the low resistivity regions;
   forming a layer of silicon over each of said collector and base contact and emitter regions;
   selectively doping the silicon layer over the emitter and the collector contact regions with N-type ions; and
   selectively doping the silicon layer over the base contact region with P-type ions.

9. A method according to claim 8 in which forming said low resistivity regions includes oppositely doping the exposed portions of the substrate.

10. A method according to claim 9 in which forming an insulative layer includes locally oxidizing a predetermined thickness of the substrate silicon within said openings so that the emitter region is reduced in width by an amount proportional to said thickness.

11. A method according to claim 8 in which the steps of forming and doping a silicon layer include:
    depositing a layer of polysilicon over the substrate;
    ion implanting the polysilicon layer in each region with ions of the dopant type therefor:
    masking and patterning over the insulative layers to define openings selectively exposing the polysilicon over low resistivity regions; and thermally oxidizing the polysilicon exposed within said openings to electrically isolate the collector and base contact and emitter regions at the reference surface.

12. A method according to claim 11 in which the openings exposing the polysilicon are sized, mutually positioned and oriented substantially in the same manner as the openings recited in claim 1.

13. A method according to claim 1 in which forming said collector region includes:
masking, patterning and ion-implanting P-type ions selectively around the collector region to define said channel stop;
locally oxidizing a predetermined thickness of the substrate silicon selectively around the collector region so that the collector region is reduced in width by an amount proportional to said thickness; and
ion implanting said N-type dopant into the P-type substrate selectively within the collector region.

14. A method according to claim 13 including:
spacing the P-type and N-type implantations a predetermined distance apart; and
diffusing said implantations so as to form a shallow gradient P-N junction around the collector region.

15. A method of making a triple-diffused bipolar transistor in a very large scale integrated circuit, comprising:
providing a lightly doped P-type silicon substrate having a reference surface;
masking and patterning the reference surface to provide a first shield layer defining and covering a collector region having a predetermined initial width and a predetermined initial length substantially greater than said width and surrounded by an exposed field region of the reference surface;
forming a field oxide layer of a predetermined thickness in the exposed field region of the substrate;
removing the first shield layer to expose the reference surface in the collector region;
implanting in the collector region an N-type collector, junction-isolated within the P-type substrate;
masking and patterning the reference surface with a second shield layer covering the collector region and having two openings of a predetermined width and spacing lengthwise of the collector region to define collector and base contact regions at opposite ends of the collector region and to define an emitter region spaced between the collector and base contact regions;
forming an N-type and a P-type low resistivity region in the substrate, respectively, self-aligned within the two openings;
forming a second oxide layer on the substrate within the two openings so as to insulatively cover the low resistivity regions;
removing the second shield layer to expose the reference surface in the emitter region and in the collector and base contact regions;
forming contacts in the collector and base contact regions self-aligned to the low resistivity regions by the second oxide layer; and
forming an NPN bipolar transistor in the emitter region by successive diffusions of a P-type base and N-type emitter self aligned by the field and second oxide layers, the emitter having a length defined by the second width of the collector region and a maximum width defined by the spacing between said openings.

16. A method according to claim 15 in which:
the masking and patterning steps include a photolithographic process for initially defining the width of the collector region and the spacing between said openings and selecting a size dimension of the initially defined width and spacing which is at least as great as a predetermined minimum reliable resolution for the photolithographic process; and
the steps of forming said oxide layers include locally oxidizing the substrate silicon in the field region and within said two openings and controlling the local oxidation steps to reduce each of the initially-defined width and spacing by predetermined amounts.

17. A method according to claim 16 in which the masking, patterning, and controlling steps include forming on the reference surface an insulative layer of a material susceptible to a predetermined etchant prior to the photolithographic process and etching said layer so as to reduce the photolithographically-defined dimension thereof by a predetermined amount prior to each of the local oxidation steps.

18. A method according to claim 16 in which the masking, patterning and controlling steps include forming on the reference surface, prior to the photolithographic process, a first layer of a first insulative material selectively susceptible to a first etchant and a second layer of a second material susceptible to a second etchant and resistant to the first etchant, successively etching each layer in turn so as to undercut the first layer beneath the first material by a predetermined distance.

19. A method according to claim 18 in which providing a substrate and implanting an N-type collector includes:
selecting as said substrate a lightly P-doped wafer;
first, implanting P-type ions in the substrate within the exposed field region prior to the first local oxidizing step;
second, implanting N-type ions into the collector region after removing the first shield layer at a spacing from the first dopant implant defined by said distance of undercut and amount of reduction in the initially-defined width of the collector region; and
annealing the substrate to diffuse the first and second implants toward one another to form a shallow-gradient P-N junction across said spacing.

20. A method according to claim 19 including spacing the implants an average of 1 um. apart.

21. A method according to claim 15 in which providing a substrate and implanting an N-type collector includes:
selecting as said substrate a lightly P-doped wafer;
first, implanting P-type ions in the substrate within the exposed field region prior to the first local oxidizing step;
second, implanting N-type ions into the collector region after removing the first shield layer;
spacing the first and second implants apart a distance in the range of 0.7 to 1.3 um.; and
annealing the substrate to diffuse the first and second implants toward one another to form a shallow-gradient P-N junction across said spacing.

22. A method according to claim 21 including:
sizing the initial width and length of the collector region to a scale of 3.4 um.× 12 um.;

reducing the initial width and lengths by about 2 um.;

sizing the width and spacing of the two openings in the second shield layer to a scale of 2 um.; and reducing the maximum width defined by said spacing by about 0.5 um., thereby to produce an average transistor area of about 14 um.$^2$ and an emitter region of an area of about 1.4 um.$^2$.

23. A method according to claim 21 including forming a plurality of said transistors on the substrate and spacing the collector regions a lengthwise center-to-center distance apart of 16 um. and width-wise center-to-center distance apart of 8 um.

24. A method of making a triple-diffused bipolar transistor in a very large scale integrated circuit, comprising:

providing a lightly doped, P-type silicon substrate having a reference surface for forming an integrated circuit;

depositing a layer of nitride and a layer of oxide, in turn, onto the reference surface;

masking and patterning an area atop the oxide layer to define a collector region having a first length and width;

selectively removing the oxide and nitride layers from around the masked area to expose a field region of the reference surface bounded by an outer edge of the oxide layer while leaving the collector region covered by remaining portions of said layers;

selectively undercutting the nitride layer a first distance beneath the outer edge of the oxide layer all around said covered collector region to define therein a first reduced collector region spaced from the field region by a first margin wherein the reference surface is exposed;

ion-implanting P-type ions solely in the field region to define a P+ channel stop within the substrate, surrounding and spaced from the first reduced collector region by said first distance;

removing the oxide layer;

locally oxidizing the substrate silicon in the exposed portions of the reference surface including the field region and the first margin, and a second margin extending a second distance beneath the nitride layer, to form an insulating thermal oxide layer defining a second reduced collector region within the first reduced collector region;

diffusing the P+ channel stop laterally inward toward the second reduced collector region by a third distance;

removing the nitride layer to expose the reference surface in the second reduced collector region;

implanting N-type ions selectively in the second reduced collector region and diffusing same downward into the substrate and laterally a fourth distance beneath the thermal oxide layer; and forming an intrinsic NPN bipolar transistor in the exposed second reduced collector region by successive diffusions of P-type ions to form a base and N-type ions to form an emitter;

the first length and width being determined and the undercutting and thermally oxidizing steps being independently controlled so as to define said first and second distances such that the second reduced collector region has a second length and width each determined by the first length and width, respectively, less two times the sum of the first and second distances, the second width defining an emitter width of the transistor;

the first and second distances being controlled so that their sum exceeds the sum of the third and fourth distances and the diffusions being controlled to produce a shallow-gradient P-N junction isolating the collector region within the substrate.

25. A method of making a triple-diffused bipolar transistor in a very large scale integrated circuit, comprising:

providing a lightly P-doped silicon substrate having a reference surface for fabrication of a transistor;

forming a collector region of N-dopant type and having a predetermined width and a length substantially greater than said width, junction-isolated within the P-type substrate and bounded by a field oxide layer at the substrate surface;

forming first and second low resistivity regions of P and N dopant types, respectively, in the substrate within the collector region immediately subjacent the reference surface;

spacing the low resistivity regions so as to define an emitter region of a predetermined width between the low resistivity regions;

sizing the low resistivity regions to a predetermined length and centrally positioning the low resistivity regions along the length of the collector region so as to define base contact and collector contact regions at opposite ends of the collector region and spaced from the emitter region by said predetermined length;

selectively doping the substrate in the emitter region between the low resistivity regions and to a first depth with P-type ions to form a base adjoining both low resistivity regions;

selectively doping the substrate with P-type ions in the base contact region laterally adjoining an end of the P-type low resistivity region;

selectively doping the substrate with N-type ions in the collector contact region laterally adjoining an end of the N-type low resistivity region;

selectively doping the substrate in the emitter region to a second depth less than the first depth with N-type ions to form an emitter;

forming contacts on each of the emitter, base contact and collector contact regions.

26. A method according to claim 25 in which forming the collector region includes masking and patterning the collector region, ion implanting a P-type channel stop into the substrate around the collector region, and forming said oxide layer on the reference surface around the collector region.

27. A method according to claim 26 including spacing the N-type collector inward of the P-type channel stop and diffusing the implants so as to form a low capacitance P-N junction around the collector region.

28. A method according to claim 25 in which forming said low resistivity regions includes masking and patterning so as to form openings defining said length, spacing and positioning.

29. A method according to claim 28 in which said openings are positioned for transsecting the collector region and sized to a lengthwise dimension sufficient to overlap the collector region by an amount not less than a predetermined alignment tolerance of a positioning apparatus.

30. A method according to claim 28 in which the openings are sized and spaced to a predetermined width and spacing not less than a minimum resolution of the masking technology.

31. A method according to claim 28 including forming an oxide layer within said openings over the low resistivity regions.

32. A method according to claim 25 including:
forming an insulative layer selectively over each of the low resistivity regions;
depositing a layer of undoped polysilicon over the reference surface and insulative layer; and
selectively doping the polysilicon layer in the emitter region with N-type ions and diffusing a portion of said ions into the substrate silicon to said second depth to form said emitter.

33. A method according to claim 32 in which forming the contacts includes selectively oxidizing the portion of the polysilicon layer on the insulative layer and oppositely doping the portions of the polysilicon layer on the collector and base contact regions.

34. In a method according to claim 32, a method of forming a resistor, including:
depositing the undoped polysilicon over a portion of the field oxide layer;
masking and patterning to shield an elongate region of the polysilicon having a predetermined width defining the width of the resistor;
selectively oxidizing the polysilicon so as to isolate the elongate region;
doping the elongate region of polysilicon to predetermined conductivity;
masking and patterning to define a pair of openings transsecting the elongate region, and
forming contacts in each of said openings;
the openings being positioned at a predetermined spacing defining a length of the resistor.

35. In a method according to claim 32, a method of forming a substrate contact, including:
forming a substrate contact region having a predetermined width and a length bounded by said field oxide layer;
selectively doping the substrate in the substrate contact region to said first depth with ions of the first dopant type;
depositing the undoped polysilicon over the reference surface in the substrate contact region and adjoining portions of the field oxide layer;
masking and patterning to shield a portion of the polysilicon in the substrate contact region;
selectively oxidizing the polysilicon of the adjoining portions of the field oxide layer so as to isolate the substrate contact region;
selectively doping the polysilicon in the substrate contact region with ions of the first dopant type; and
forming a contact on the polysilicon in the substrate contact region.

* * * * *

UNITED STATES PATENT AND TRADEMARK OFFICE
CERTIFICATE OF CORRECTION

PATENT NO. : 4,866,001

DATED : September 12, 1989

INVENTOR(S) : James M. Pickett et al.

It is certified that error appears in the above-identified patent and that said Letters Patent is hereby corrected as shown below:

| | |
|---|---|
| Cover page, | change filed date from "Jan. 11, 1988" to --Jan. 11, 1989--; |
| Column 2, | lines 64 & 65, change "23-2-5October" to --23-25 October--; |
| Column 11, | line 31, change "122" to --102--; |
| Column 12, | line 39, change "$mil^2$" to --$mil^2$-- (should be printed as a lower case "L" and not as a numeral "1" (one)); |
| Column 13, | line 19, change "making" to --masking--; |
| Column 14, | line 29, after "intrinsic" insert --bipolar--; |
| | line 43, after "intrinsic" insert --bipolar--; |
| Column 16, | line 10, change "process:" to --process;--; |
| Column 17, | line 11, change "width-wise" to --widthwise--; |
| Column 20, | line 21, change "of" to --on--; |

UNITED STATES PATENT AND TRADEMARK OFFICE
CERTIFICATE OF CORRECTION

PATENT NO. : 4,866,001
DATED : September 12, 1989
INVENTOR(S) : James M. Pickett et al.

It is certified that error appears in the above-identified patent and that said Letters Patent is hereby corrected as shown below:

Cancel Claim #24.

In addition to the previously cited changes, please make the below addition in the areas on the cover page titled:

References Cited

| Document | Date | Name | Class | Sub-class |
| --- | --- | --- | --- | --- |
| 4,283,235 | 1/1981 | Raffel et al. | 437 | 31 |
| 3,993,513 | 11/1976 | O'Brien | 437 | 31 |
| 4,322,882 | 4/1982 | Vora | 437 | 31 |
| 4,398,962 | 8/1983 | Kanazawe | 437 | 31 |
| 4,437,897 | 4/1984 | Kemlage | 437 | 31 |
| 4,641,170 | 2/1987 | Ogura et al. | 357 | 35 |
| 4,583,106 | 4/1986 | Anentha et al. | 357 | 35 |
| 4,430,793 | 2/1985 | Hart | 357 | 59H |
| 4,381,953 | 5/1983 | Ho et al. | | |

UNITED STATES PATENT AND TRADEMARK OFFICE
CERTIFICATE OF CORRECTION

PATENT NO. : 4,866,001  Page 3 of 4
DATED : September 12, 1989
INVENTOR(S) : James M. Pickett et al.

It is certified that error appears in the above-identified patent and that said Letters Patent is hereby corrected as shown below:

4,483,726 11/1984 Isaac et al.

OTHER PUBLICATIONS

L.L. Vadasz et al., "Silicon-Gate Technology," IEEE Spectrum, October 1969, pages 28-35.

C. S. Oh, et al., "A New MOSFET Structure with Self-Aligned Polysilicon Source and Drain Electrodes," IEEE Electron Device Letters, Vol. EDL-5, No. 10, October 1984, pages 400-402.

"A Bipolar Process That's Repelling CMOS," Electronics, December 23, 1985, pages 45-47.

R. Wolfle, "Fast High-Voltage Silican Triple-Diffused Power Transistors," Siemens Review XXXIX (1972), No. 8, pages 370-373.

S. Konaka et al., "A 30 ps Si Bipoloar IC Using Super Self-Aligned Process Technology," Extended Abstracts of the 16th (1984 International) Conference on Solid State Devices and Materials, Kobe 1984, pages 209-212.

UNITED STATES PATENT AND TRADEMARK OFFICE
CERTIFICATE OF CORRECTION

PATENT NO.  :   4,866,001

DATED       :   September 12, 1989

INVENTOR(S) :   James M. Pickett et al.

It is certified that error appears in the above-identified patent and that said Letters Patent is hereby corrected as shown below:

W. J. Chudobiak, "On the Static Collector-Emitter Saturation Voltage of a Transistor with a Lightly Doped Collector," Proceedings of the IEEE, April 1969, pages 718-720.

F. Morandi et al., "Controlled Undercut Microwave Devices," SGS-Fairchild, S.P.A., Milan, Italy, International Electron Devices Meeting, 23-25 October 1968, Washington, D.C. (abstract published by IEEE 1968), page 108.

J. A. Appels et al., "Local Oxidation of Silicon; New Technological Aspects," Philips Research Reports, Vol. 26, No. 3 (June 1971), pages 157-165.

J. S. Makris et al., "Forming Fine-Line Geometries in Integrated Circuits," IBM Technical Disclosure Bulletin, Vol. 16, No. 10 (March 1974), pages 3240-3241.

Gray, Paul R. and Meyer, Robert G., <u>Analysis and Design of Analog Integrated Circuits</u>, 1984, Chapter 2, pp. 76-166.

Signed and Sealed this

First Day of October, 1991

Attest:

HARRY F. MANBECK, JR.

Attesting Officer

Commissioner of Patents and Trademarks